Oct. 13, 1970 N. J. TOLAR 3,533,148

THIN FILM CAPACITORS

Filed July 25, 1967

INVENTOR
Neal J. Tolar

BY John E. Vandigriff
ATTORNEY

United States Patent Office 3,533,148

Patented Oct. 13, 1970

3,533,148

THIN FILM CAPACITORS

Neal Jay Tolar, Richardson, Tex., assignor to Texas Instruments Incorporated, Dallas, Tex., a corporation of Delaware Filed July 25, 1967, Ser. No. 655,814

Int. Cl. H01g *13/06*

U.S. Cl. 29—25.41 3 Claims

ABSTRACT OF THE DISCLOSURE

Disclosed is a method for fabricating thin film capacitors on unglazed ceramic substrates.

This invention relates to the fabrication of thin film capacitors and more particularly to the fabrication of such capacitors on an unglazed ceramic substrate.

In the past it has not been practical to fabricate integrated circuits utilizing thin film capacitors with a reasonable degree of success on an unglazed ceramic substrate. Although present day polishing techniques are very advanced, it is not possible to polish a substrate of unglazed polycrystalline ceramic substrate to the degree necessary for the fabrication of thin film capacitors. Imperfections in the surface of the polished substrates occur because of porosity in material and because small grains of the surface become loose from the surface during polishing. These surface imperfections cause thin areas in the dielectric films used to fabricate capacitors. Such capacitors have too low breakdown voltage or have shorts.

In order to fabricate circuits with thin capacitors of such ceramic substrates, the substrates are usually glazed. While glazing permits fabrication of such capacitors, it causes other undesirable effects. The dielectric constants of the glaze and the unglazed substrate are different. The thickness of the glaze varies across the substrate. These factors cause high frequency trip-line circuits to see varying impedances leading to losses and unpredictable behavior.

The thermal conductivity of the unglazed substrate is substantially better than that of the glazed. For high $Al_2O_3$ content substrates the thermal conductivity is about 0.072 cal./sec./cm.$^2$/° C./cm. at 100° C. compared to a value of about 0.003 for the sodium borosilicate glaze commonly used. Because of this large difference in the thermal conductivities the glaze greatly increases the thermal impedance even though the glaze is much thinner than the substrate itself. The increased thermal impedance reduces the power that the substrate can dissipate, therefore providing undesirable effects where power devices are mounted on the substrate.

It is therefore an object of the invention to provide a method of producing thin film capacitors upon an unglazed ceramic substrate.

Another object of the invention is to provide a method of preparing a capacitor electrode desposited upon an unglazed ceramic substrate.

It is a feature of this invention to provide a thin film capacitor upon an irregular surface of a substrate.

Other objects and features of this invention will be apparent from the following detailed description taken in conjunction with the appended claims and the attached drawing in which:

FIG. 1 is a block diagram showing the basic steps of the process of the invention;

FIGS. 2*a* through 2*d* show elevational views of the various stages of the wafer and the capacitor during manufacture;

Figures 1, 2, 3, 4:
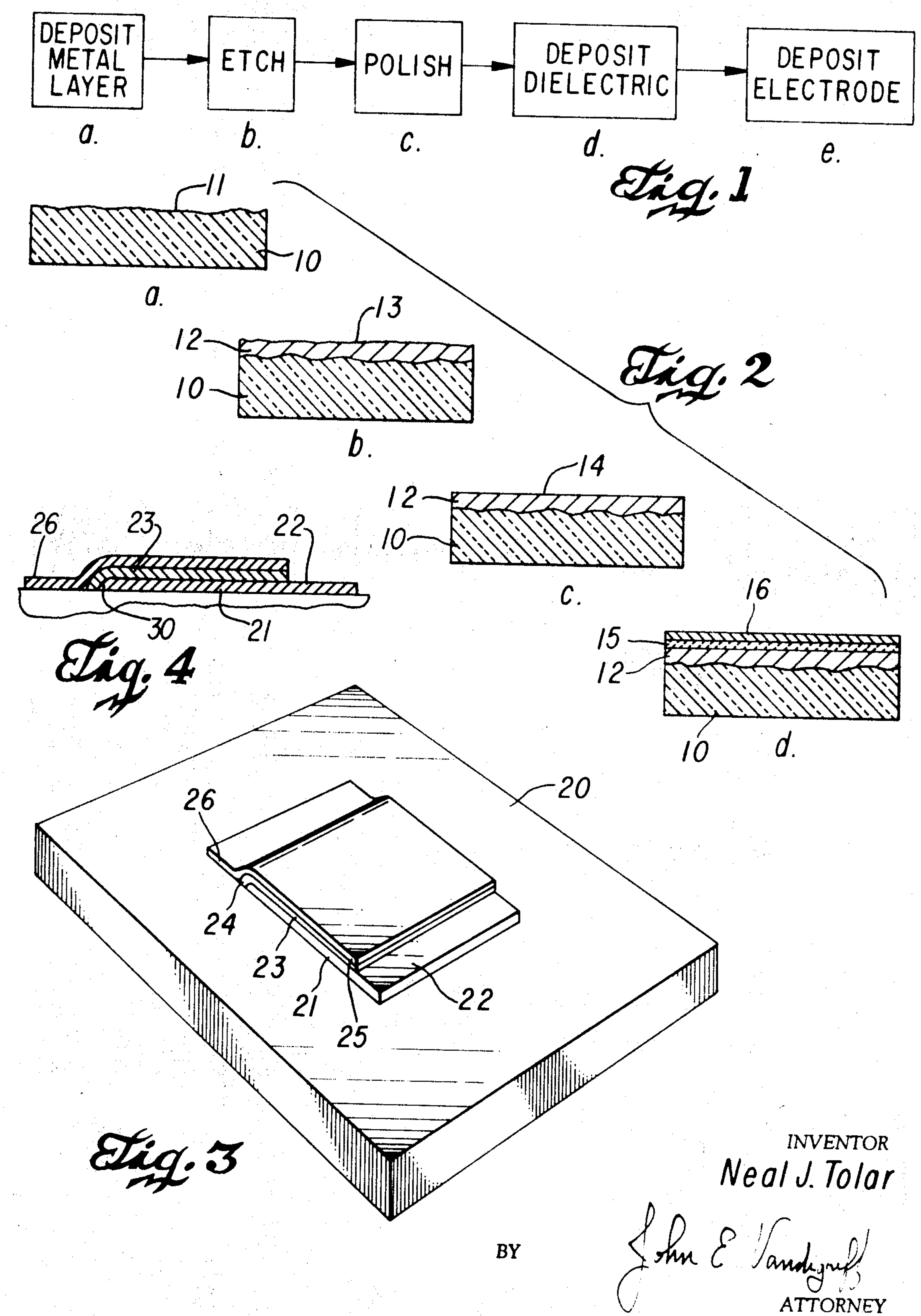
FIG. 3 shows a pictorial view of a capacitor on a substrate.
FIG. 4 shows an elevational sectional view of the capacitor shown in FIG. 3.

FIG. 1 is a block diagram of the basic steps which may be used in producing a thin film capacitor according to the present invention. Metal is deposited upon a substrate (Block *a*) and a portion of this metal is etched to remove (Block *b*) unwanted portions to define specific configurations. This etching step may include the masking of the deposited metal layer with example, an etch resistant metal mask, wax or a photoresist polymer which may be exposed to light through a mask to define a desired configuration. One example of a suitable photoresist polymer is known by the tradename of Kmer and is manufactured by Eastman Kodak Company. Other suitable polymers are available and the Kmer is mentioned only as by way of example.

The step of polishing is designated in Block *c*. The portion of the deposted metal layer that remains after etching is polished to remove the surface irregularities which wil be more specifically explained hereinafter.

After the metal layer has been polished, a dielectric layer is deposited (Block *d*), this being the dielectric of the capacitor. Numerous dielectrics may be used, some of which are formed by depositing oxide layers, others by oxidizing baths which form an oxide coating on the deposited metal layer. One suitable dielectric material is silicon dioxide which may be formed, for example, by reactively sputtering silicon dioxide onto the surface of the metal layer.

In Block *e* the step of depositing an electrode is designated, this electrode being the second electrode of the capacitor, the metal layer first deposited being the other electrode. These basic steps *a* through *e* show the basic steps of the process by which the two metallic electrodes and the dielectric therebetween are formed. Various other process steps well known in the art may be involved in conjunction with the basic steps to provide the finished capacitor.

The formation of a discrete capacitor is shown in FIG. 2, and in FIG. 2*a* the substrate 10 is shown, for example, unglazed ceramic material, the top surface 11 of which is irregular due to the porosity of the ceramic. In FIG. 2*b* a metal layer 12 has been deposited on the surface 11 of the ceramic substrate. This metal may be, for example, aluminum. The surface 13 of the aluminum is irregular and takes the same general configuration as the surface 11 of the unglazed ceramic substrate. It is desirable that the surface 13 be smooth before the dielectric is deposited thereon. In FIG. 2*c* the surface 13 has been polished down to form the smooth surface 14 on the layer 12. In FIG. 2*d* the dielectric layer 15 has been added and a second metal layer 16 has been formed on top of the dielectric layer. Layers 12 and 16 form the two electrodes of the capacitor and the layer 15 as mentioned above is the dielectric portion of the capacitor.

Since heretofore it has not proven feasible to form a capacitor on an unglazed substrate due to the porosity and uneven surface of the substrate, it is necessary to devise a method of producing a smooth electrode. This is accomplished by polishing the bottom capacitor electrode to remove the irregular surface. In the example shown in FIG. 2, layer 12 has a smooth surface 14 after polishing. One method of polishing this layer is to use 0.3 micron particles of $Al_2O_3$ in a slurry of water and apply this to the layer 12 with a polishing cloth. The process is then repeated using a 0.05 micron $Al_2O_3$ water slurry and again polishing the substrate. The first polishing step is continued until the original roughness in the bottom plate metallization is removed. The second step is continued until the scratches from the first polishing step are removed. Then, to give a smoother finish a third polishing step of polishing with a water slurry of $MgCO_3$ applied with a polishing cloth is used. The third step is used until the scratches from the second step are removed. After the third polishing step is completed the dielectric, for example, about 3000 A. of reactively sputtered $SiO_2$ may be deposited upon the polished metal layer. Since the layer 12 presents a smooth surface 14 to the dielectric, it will also form a smooth layer upon which the third layer 16 may be formed.

Comparative capacitor test patterns using both polished and unpolished bottom plates of aluminum on unglazed substrates with 3000 A. of reactively sputtered $SiO_2$ and aluminum top plates show the advantage of the polishing procedure. The unpolished aluminum capacitors had an average breakdown of 22 volts and a minimum breakdown of 5 volts. The polished aluminum capacitors had an average breakdown of 139 volts and a minimum breakdown of 80 volts. The increase in minimum breakdown voltage due to the use of a polished substrate is particularly significant because the 5-volt breakdown represents an undesirable condition while the 80-volt minimum is a very useful and desirable breakdown condition for circuit applications.

FIG. 3 shows one portion of a ceramic substrate upon which a capacitor has been formed. Since it is often desirable to form capacitors in conjunction with other circuit elements to form integrated circuits and the like, it is necessary that the capacitor be defined to some very small portion of a large substrate. In doing so, it is also necessary to form contacts to the capacitors which may be interconnected with the various other elements in the circuit. FIG. 3 shows one portion of a substrate upon which a capacitor has been formed. It should be noted that the bottom layer 21 forms the bottom electrode of the capacitor and extends out exposing a portion 22 which may be used to provide contact to other circuit elements. The dielectric layer 23 is formed over a portion of the bottom layer 23 and extends down into contact with the substrate 20 at 24. The top electrode of the capacitor 25 extends over the dielectric and down onto the substrate so contact may also be made to the top electrode on the surface of the substrate. The contact areas 22 and 26 may be extended to form interconnections with other devices on the surface of the substrate. As pointed out above, the dielectric layer 23 extends over one end of the lower contact 21 onto the substrate at 24. This is to prevent the upper electrode from coming into direct electrical contact with the bottom electrode as it is brought over the side of the capacitor down to the surface of the substrate.

FIG. 4 shows a cross-sectional view of the capacitor illustrated in FIG. 3. It should be noted that the edge 30 of the first metal layer 21 is rounded. This rounding is caused by the polishing of the layer to remove the surface irregularities and enhances the characteristics of the capacitor. The rounded corner permits a more even distribution of the dielectric material, therefore a better capacitor.

In FIG. 3, the capacitor is shown to be generally square; however, it could be either round, rectangular or in any manner to obtain the desired capacitance. Since capacitance depends upon the surface area of the electrode, the type of dielectric and the distance between the electrode plates, these dimensions may be changed to provide the desired capacity value.

Although the present invention has been shown and illustrated in terms of a specific preferred embodiment, it will be apparent that changes and modifications are possible without departing from the spirit and scope of the invention as defined in the appended claims.

What is claimed is:

1. A method of making thin-film capacitors on an irregular substrate surface comprising the steps of:

(a) depositing a first electrode on said irregular surface, said electrode having an irregular surface conforming with the irregular surface of said substrate;

(b) polishing said electrode to render the surface thereof of substantially smooth and flat by applying a water slurry of $Al_2O_3$ thereto with a polishing cloth;

(c) forming a dielectric material on said first electrode; and (d) depositing a second electrode on said dielectric material to form said capacitor.

2. A method as defined by claim 1 further including the step of polishing the irregular surface of the first electrode with a water slurry of $MgCO_3$.

3. A method as defined by claim 1 wherein said polishing with $Al_2O_3$ includes successive steps of using a particle size of 0.3 micron and 0.05 micron, respectively.

References Cited

UNITED STATES PATENTS

| | | | |
|---|---|---|---|
| 2,808,542 | 11/1957 | Vermilyea | 317—230 |
| 2,993,266 | 7/1961 | Berry | 317—230 X |
| 3,273,033 | 9/1966 | Rossmeisl | 317—261 |
| 3,376,481 | 4/1968 | Klerer | 317—230 X |
| 3,275,915 | 9/1966 | Harinxma | 317—261 |
| 3,395,091 | 7/1968 | Sinclair | 317—235 X |

FOREIGN PATENTS

| | | |
|---|---|---|
| 980,256 | 1/1965 | Great Britain. |

JAMES D. KALLAM, Primary Examiner

U.S. Cl. X.R.

317—230, 258